United States Patent
Cheng et al.

(10) Patent No.: US 7,606,340 B2
(45) Date of Patent: Oct. 20, 2009

(54) PHASE DETECTION DEVICE AND METHOD THEREOF

(75) Inventors: Yuh Cheng, Chubei (TW); Pi-Hai Liu, Hsinchu (TW); Meng-Ta Yang, Chu-Nan Chen (TW)

(73) Assignee: Mediatek Inc., Hsin-Chu (TW)

( * ) Notice: Subject to any disclaimer, the term of this patent is extended or adjusted under 35 U.S.C. 154(b) by 676 days.

(21) Appl. No.: 11/223,064

(22) Filed: Sep. 9, 2005

(65) Prior Publication Data

US 2007/0058764 A1    Mar. 15, 2007

(51) Int. Cl.
*H04L 7/00* (2006.01)
(52) U.S. Cl. .................... 375/354; 375/371; 375/373
(58) Field of Classification Search .......... 375/371, 375/373, 375, 376; 369/43, 47.28, 47.31, 369/47.35
See application file for complete search history.

(56) References Cited

U.S. PATENT DOCUMENTS 6,934,229 B2 *   8/2005   Fujiwara .................. 369/47.28
2003/0184677 A1 * 10/2003  Kuzumoto et al. .......... 348/465
2003/0227852 A1 * 12/2003  Ogawa .................... 369/59.23
2004/0081051 A1    4/2004  Kimura et al. ........... 369/53.34
2007/0047414 A1 *  3/2007  Chu et al. ............... 369/59.11

FOREIGN PATENT DOCUMENTS

| EP | 0820061    | 1/1998 |
|----|------------|--------|
| JP | 2002015523 | 1/2002 |
| JP | 2002107394 | 4/2002 |

OTHER PUBLICATIONS

CN Office Action mailed Apr. 18, 2008.

* cited by examiner

*Primary Examiner*—Chieh M Fan
*Assistant Examiner*—Jaison Joseph
(74) *Attorney, Agent, or Firm*—Thomas, Kayden, Horstemeyer & Risley

(57) ABSTRACT

A phase detection device comprising an analog-digital converter, an interpolator, and a determining unit. The analog-digital converter receives an analog signal and converts the analog signal to a digital signal according to a plurality of digital sampling points. The interpolator generates a plurality of interpolation points according to a predetermined amount of digital sampling points. The determining unit obtains a phase of the ZC point according to the interpolation points or the digital sampling points.

44 Claims, 14 Drawing Sheets

| Sel4 | Sel3 | Sel2 | Sel1 | Sel0 | $\tau_{zc}$ | Sel4 | Sel3 | Sel2 | Sel1 | Sel0 | $\tau_{zc}$ |
|---|---|---|---|---|---|---|---|---|---|---|---|
| 0 | 1 | 0 | 0 | 0 | 15 | 1 | 0 | 0 | 0 | 0 | 31 |
| 0 | 1 | 0 | 0 | 1 | 14 | 1 | 0 | 0 | 0 | 1 | 30 |
| 0 | 1 | 0 | 1 | 1 | 13 | 1 | 0 | 0 | 1 | 1 | 29 |
| 0 | 1 | 0 | 1 | 0 | 12 | 1 | 0 | 0 | 1 | 0 | 28 |
| 0 | 1 | 1 | 1 | 0 | 11 | 1 | 0 | 1 | 1 | 0 | 27 |
| 0 | 1 | 1 | 1 | 1 | 10 | 1 | 0 | 1 | 1 | 1 | 26 |
| 0 | 1 | 1 | 0 | 1 | 9 | 1 | 0 | 1 | 0 | 1 | 25 |
| 0 | 1 | 1 | 0 | 0 | 8 | 1 | 0 | 1 | 0 | 0 | 24 |
| 0 | 0 | 1 | 0 | 0 | 7 | 1 | 1 | 1 | 0 | 0 | 23 |
| 0 | 0 | 1 | 0 | 1 | 6 | 1 | 1 | 1 | 0 | 1 | 22 |
| 0 | 0 | 1 | 1 | 1 | 5 | 1 | 1 | 1 | 1 | 1 | 21 |
| 0 | 0 | 1 | 1 | 0 | 4 | 1 | 1 | 1 | 1 | 0 | 20 |
| 0 | 0 | 0 | 1 | 0 | 3 | 1 | 1 | 0 | 1 | 0 | 19 |
| 0 | 0 | 0 | 1 | 1 | 2 | 1 | 1 | 0 | 1 | 1 | 18 |
| 0 | 0 | 0 | 0 | 1 | 1 | 1 | 1 | 0 | 0 | 1 | 17 |
| 0 | 0 | 0 | 0 | 0 | 0 | 1 | 1 | 0 | 0 | 0 | 16 |

FIG. 9

PHASE DETECTION DEVICE AND METHOD THEREOF

BACKGROUND

The invention relates to a phase detection device and method, and in particular to a phase detection device and method for detecting the phase of the zero crossing point after the analog to digital conversion.

The electronic apparatus always has to convert the analog signal to a digital signal for the following signal processing. In the process of the analog-to-digital conversion, an analog-to-digital converter samples the analog signal once at every rising edge of a sampling clock. Under ideal conditions, zero-cross (ZC) points of the analog signal match the rising edges of the sampling clock. However, due to the defective wave shape of the analog signal or the problems happened in the electronic apparatus, the phase difference between one ZC point and the corresponding rising edge of the sampling clock are appeared. The phase difference is called jitter. The jitter affects the quality of the digital signal. Thus, a Phase detection device is required to detect the jitter or the ZC point of the analog signal, and the digital signal could be adjust accordingly.

SUMMARY

An exemplary embodiment of a phase detection device comprises an analog-to-digital converter, an interpolator, and a determining unit. The analog-to-digital converter receives an analog signal and converts the analog signal to a digital signal according to a plurality of digital sampling points. The interpolator calculates a plurality of interpolation points between two digital sampling points. The determining unit obtains a phase of a zero-cross (ZC) point according to the interpolation points or the digital sampling points.

The interpolator outputs a plurality of selection signals according to signs of the values of the interpolation points or the digital sampling points, and the determining unit obtains the phase of the ZC point according to the selection signals.

In some embodiments, the determining unit generates the selection signals with an XOR operation to obtain the phase of the ZC point.

In some embodiments, the determining unit is implemented by a lookup table, and the lookup table collects a plurality of phases and selects one phase corresponding to the ZC point according to the selection signals.

In some embodiments, the determining unit comprises a calculator receiving the selection signals and the phase of the two digital sampling points adjacent to the ZC point, and the calculator calculates the phase of the ZC point according to the selection signals.

The phase detection device can further comprise a phase looked loop (PLL) circuit. The PLL circuit receives the digital signal and generates a clock synchronized with the digital signal to serve as a sampling clock of the analog-digital converter. When the PLL circuit is implemented in the phase detection device, the phase of the ZC point obtained by the determining unit is equal to a jitter of the ZC point.

In some embodiments, the phase detection device is applied in an optical disc drive. The jitter can be used to regulate write strategy of the optical disc drive The jitter can be used to calibrate servo parameters of the optical disc drive.

DESCRIPTION OF THE DRAWINGS

The invention will become more fully understood from the detailed description given hereinbelow and the accompanying drawings, given by way of illustration only and thus not intended to be limitative of the invention.

FIG. 9 depicts an embodiment of a determining unit.

DETAILED DESCRIPTION

Figure 1:
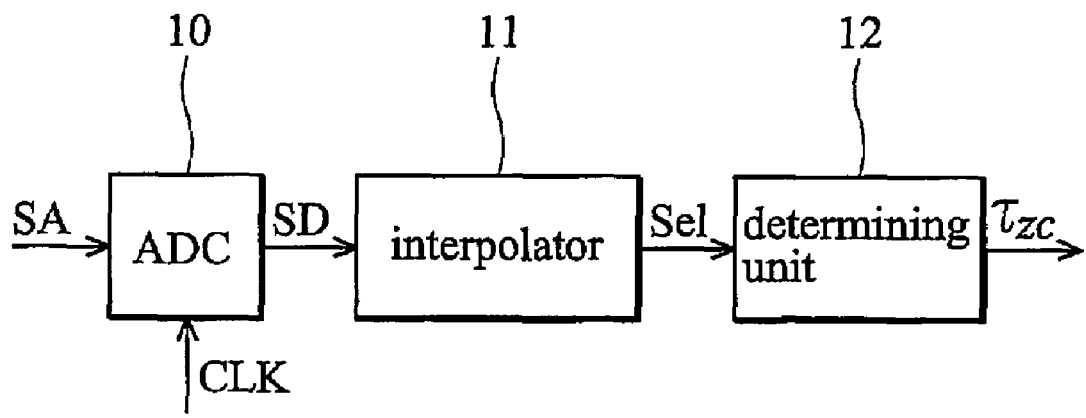
FIG. 1 depicts an embodiment of a phase detection device.
Figure 2:
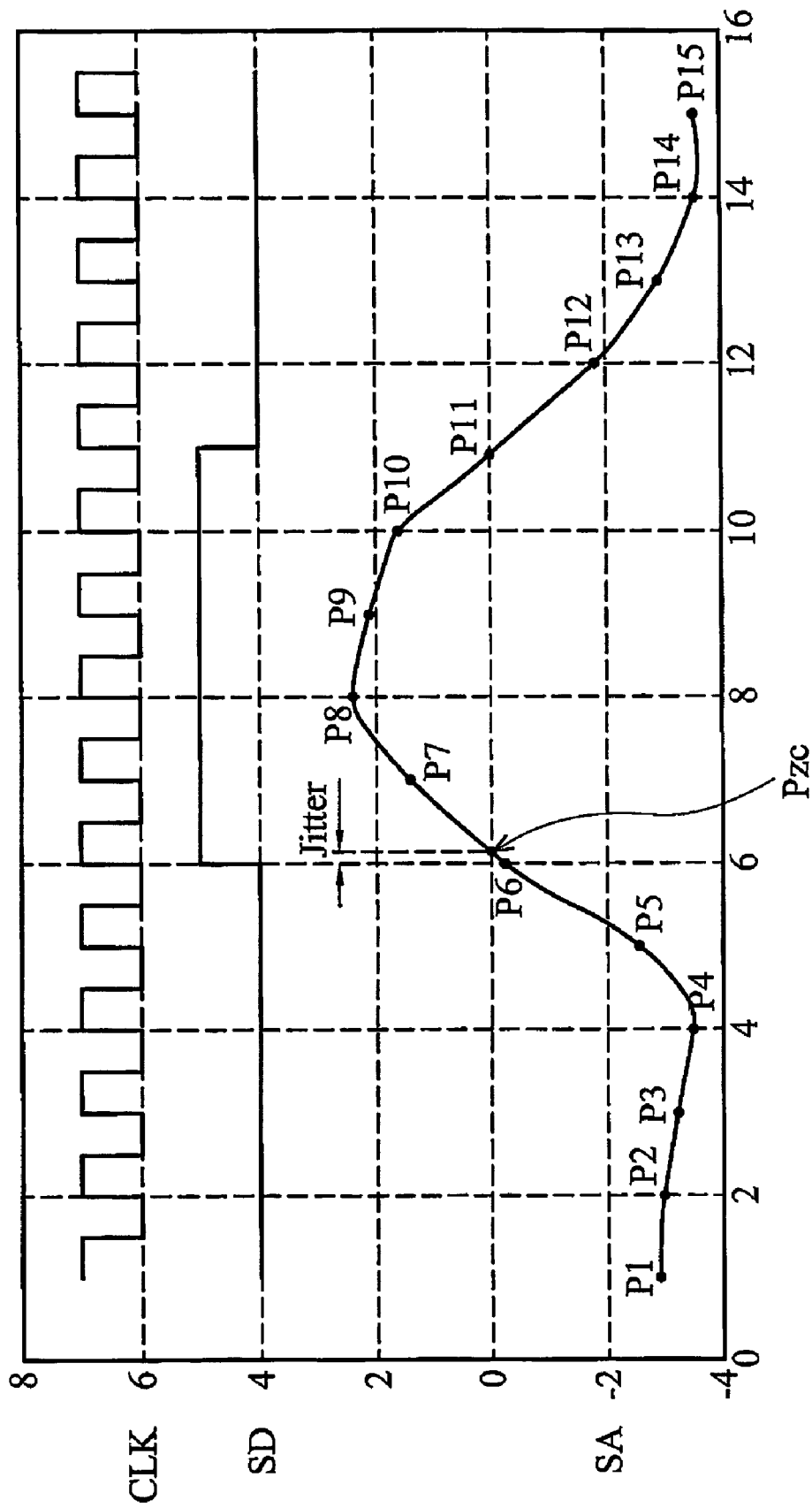
FIG. 2 depicts a sampling of an analog signal by a clock signal CLK.

Phase detection devices are provided. In some embodiments, as shown in FIG. 1, a phase detection device 1 comprises an analog-to-digital converter (ADC) 10, an interpolator 11, and a determining unit 12. The ADC 10 receives an analog signal SA and converts the analog signal SA to a digital signal SD with a plurality of digital sampling points. Referring to FIG. 2, to convert the analog signal SA to the digital signal SD, the ADC 10 samples the analog signal SA at the digital sampling points P1 to P15 according to a sampling clock CLK. The ADC 10 samples the analog signal SA once at every rising edge of the sampling clock CLK, representing one digital sampling point. Referring to FIG. 2, one zero-cross (ZC) point Pzc of the analog signal SA is not at any one of the digital sampling points, however, there is a phase difference between the ZC point Pzc and the digital sampling point P6. This means a jitter occurs between the ZC point Pzc and the digital sampling point P6.

Figure 3:
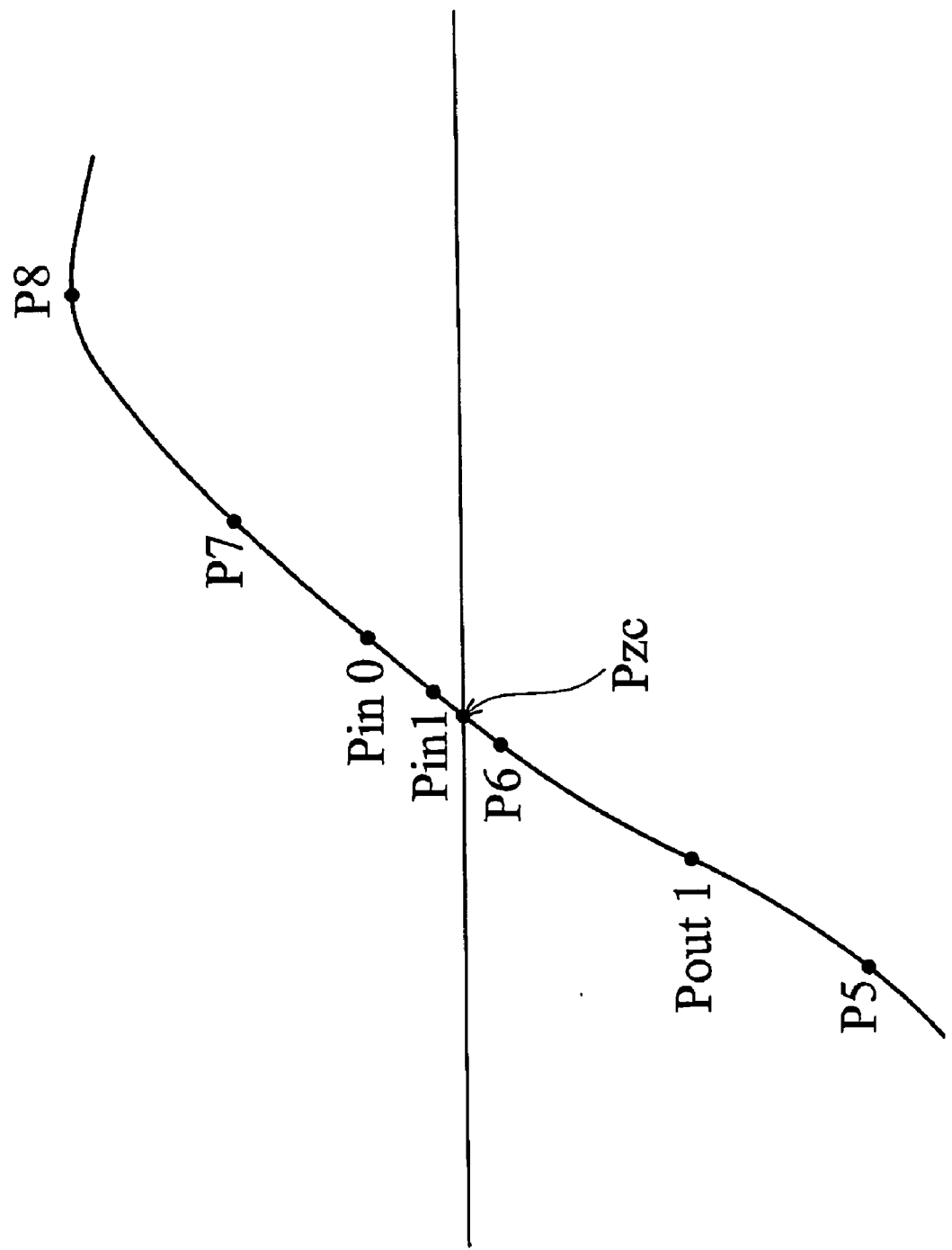
FIG. 3 depicts an example of a multi-points interpolation algorithm.

Since the ZC point Pzc is between digital sampling points P6 and P7, the interpolator 11 calculates a plurality of interpolation points between the digital sampling points P6 and P7. FIG. 3 depicts an example of a multi-points interpolation algorithm. By repeatedly performing the interpolation operation, the interpolator 11 can find an interpolation point which is nearest the ZC point Pzc.

The interpolator 11 can utilize many kinds of interpolation algorithms, such as multi-points interpolation. The multi-point interpolation means the interpolator 11 obtains a plurality of boundary points to generate an interpolation point in between the two target boundary points. As shown in FIG. 3, in some embodiments, the interpolator 11 can use the sampling points P5, P6, P7 and P8 as the boundary points to generate the interpolation points. In some embodiments, the interpolator 11 can use more or less sampling points to generate the interpolation points. When the interpolator 11 selects more boundary points, the generated interpolation points are closer to the analog signal SA.

The interpolator 11 can also change the boundary points when each time executing the interpolation. For example, as shown in FIG. 3, firstly, the interpolator 11 can use four sampling points P5, P6, P7, and P8 as the beginning boundary points to generate an interpolation point Pin0 between the two middle sampling points P6 and P7, and another interpolation point Pout1 between the two sampling points P5 and P6. Secondly, the interpolator 11 use the other four points such as Pout1, P6, Pin0, P7 as the new boundary points to get the interpolation point Pin1 in between the Pin0 and P6. Repeat the saying steps, the interpolator 11 can get the interpolation point close to the ZC point Pzc. When the boundary is change during executing the interpolation, this method is called "recursive".

In some embodiments, the interpolator 11 can use a multi-points interpolation algorithm for the first section of the analog signal SA and use a two-points interpolation algorithm for the second section thereof. That's due to the first interpolation is highly affect the result of the interpolation. When we get the accurate first interpolation point, the curve between the first interpolation point and the corresponding boundary point is always nearly a linear curve. Then we can use the two-points interpolation method to get the following interpolation points.

The interpolator 11 can also generate an interpolation point at a target position. For example, the interpolator 11 can generated the interpolation point in the half position between the two target boundary points. It can also generate the interpolation point at the ¼ position. When the interpolator 11 generates the interpolation point at the half position of each two target boundary points at each time executing the interpolation, this method is called a bisection interpolation method.

In order to explain the present invention more clearly, the interpolator 11 uses a two-points interpolation algorithm with a bisection method to generate the interpolation points in the following embodiment description. The interpolator 11 also determines signs of the values of the interpolation points and generates a plurality of selection signals Sel according to the determined result. The determining unit 12 obtains a phase of the ZC point Pzc according to the selection signals Sel.

Figure 4:
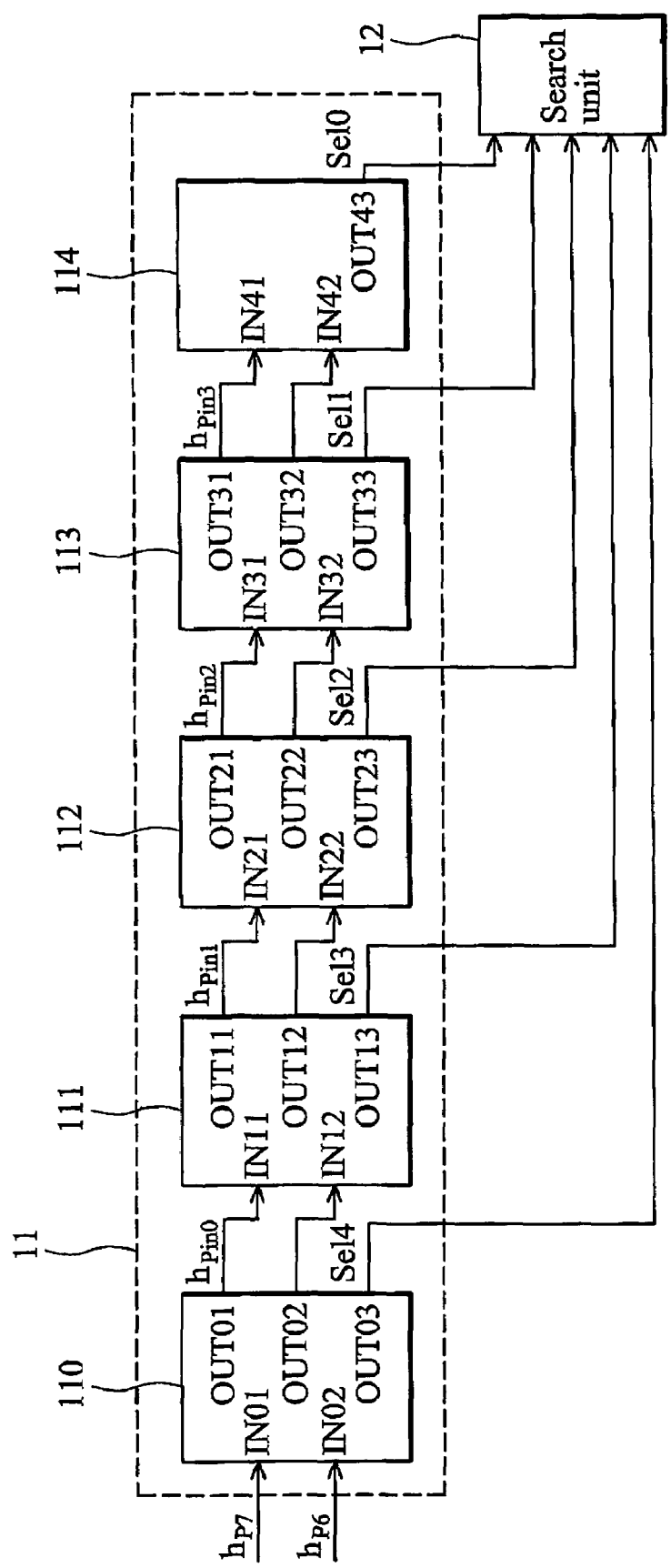
FIG. 4 depicts an embodiment of the interpolator in FIG. 2.

FIG. 4 depicts an embodiment of the interpolator 11 of FIG. 1. The interpolator 11 comprises a plurality of detection units coupled in series. The number of interpolation points generated by the interpolator 11 is equal to the number of detection units. In FIG. 4, five detection units 110 to 114 are given as an example, meaning that there are five interpolation points generated by the interpolator 11 and each detection unit generates one interpolation point. Each detection unit comprises first and second input terminals and first and second output terminals, and the first and second output terminals of each detection unit are respectively coupled to first and second input terminals of the next detection unit. For example, the first output terminal OUT01 of the detection unit 110 is coupled to the first input terminal IN11 of the detection unit 111, and the second output terminal OUT02 of the detection unit 110 is coupled to the second input terminal IN12 of the detection unit 111. Each detection unit further comprises a third output terminal. The third output terminals OUT03, OUT13, OUT23, OUT33, and OUT43 are coupled to the determining unit 12.

In each detection unit, the first and second input terminals respectively receive values of first and second boundary points. Each detection unit generates an interpolation point between the first and second boundary points and outputs the value of the interpolation point from the first output terminal to serve as the value of the first boundary point of the next detection unit. Each detection unit also outputs the value of one of the first and second boundary points to serve as the value of the second boundary point of the next detection unit. Each detection unit further determines the signs of the values of the interpolation points and generates a selection signal according to the determined result. The value of one interpolation point may be positive or negative. The sign is "+" when the value is positive, and the sign is "−" when the value is negative. Because the interpolator 11 generates interpolation points between the digital sampling points P6 and P7, the first detection unit 110 receives the values of the digital sampling points P7 and P6 to respectively serve as the values of the first and second boundary points thereof.

Figure 5:
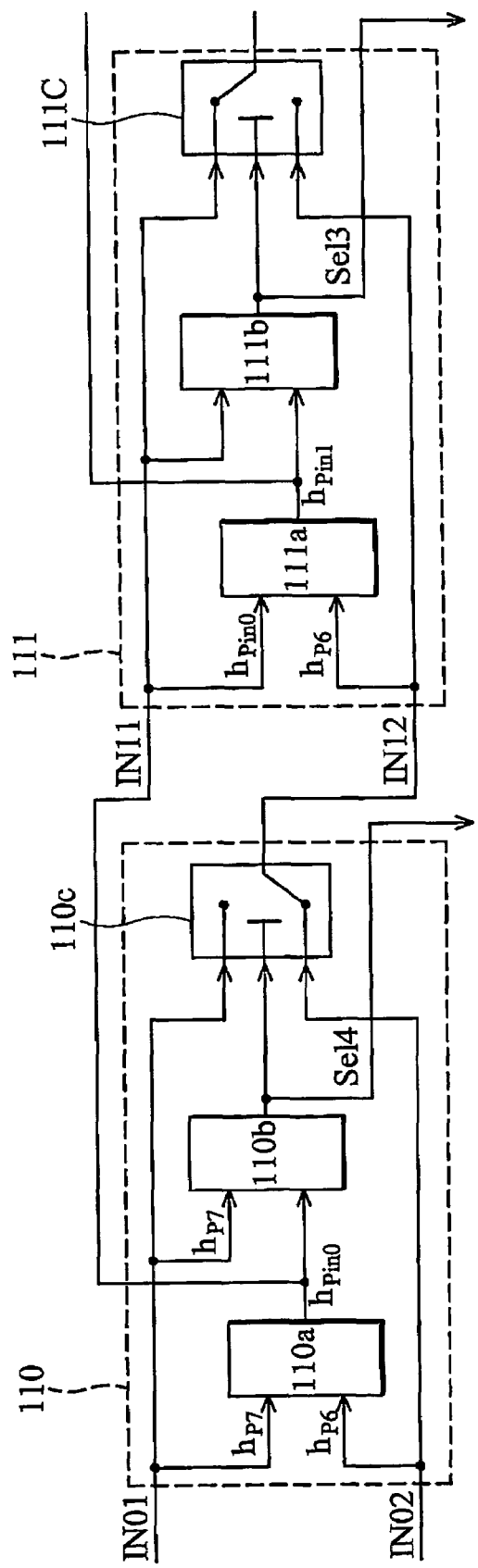
FIG. 5 is a block diagram of detection units of the interpolator.
Figure 6:
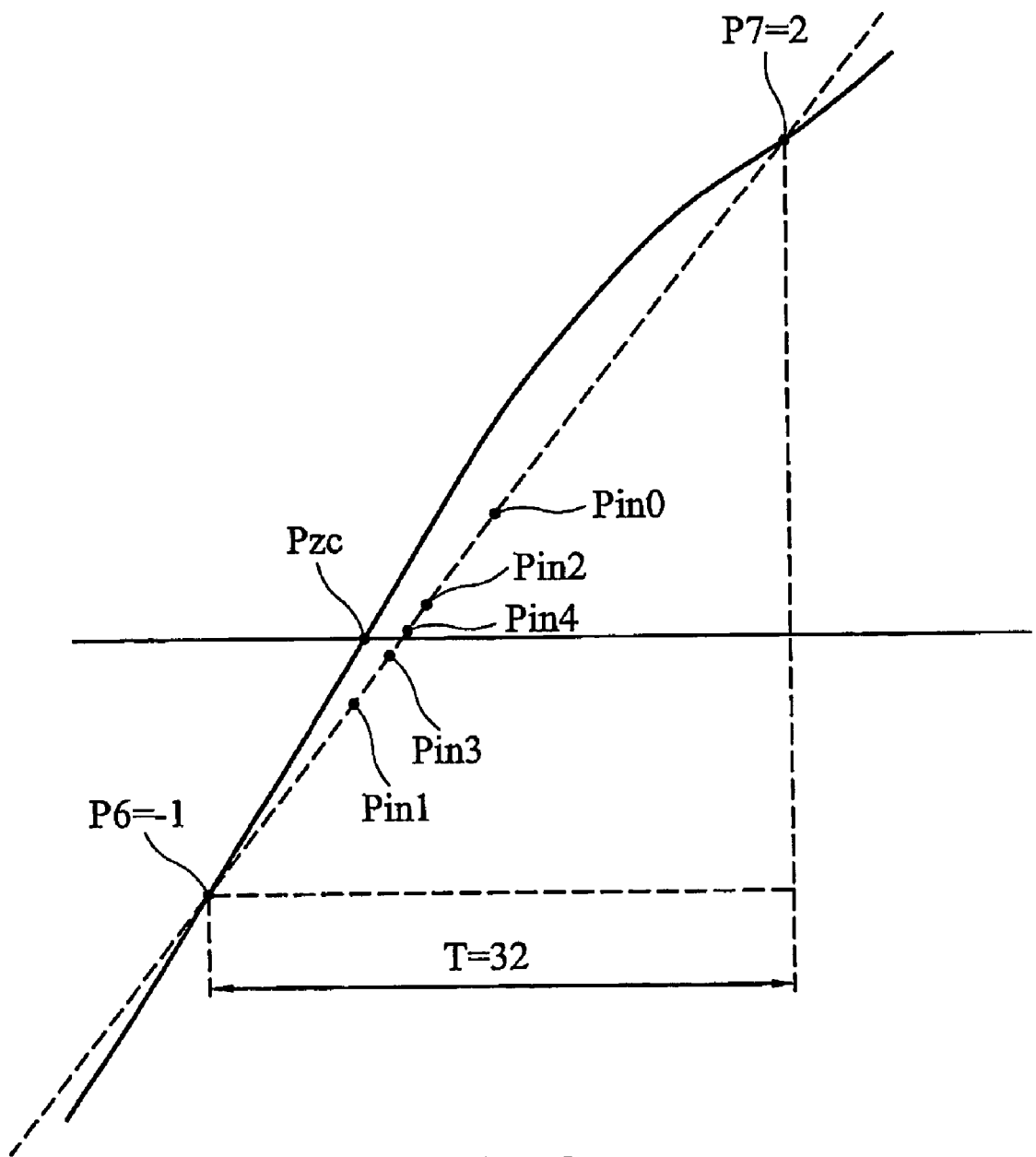
FIG. 6 depicts the interpolation points between the digital sampling points adjacent to a zero-cross point.

FIG. 5 is a block diagram of the detection units. For clarity, FIG. 5 shows only the detection units 110 and 111. The detection unit 110 is given as an example. The detection unit 110 comprises an interpolation unit 110a, a zero-cross (ZC) selection unit 110b, and a multiplexer 110c. The operations of the detection units are described in conjunction with FIGS. 5 and 6. It is assumed that the sampling time of the ADC 10 is 1T (T=32t), the value of the digital sampling points P6 is equal to −1, and the value of the digital sampling points P7 is equal to 2. The interpolation unit 110a of the detection unit 110 receives the values of the digital sampling points P7 and P6 respectively by the input terminals IN01 and IN02 and generates an interpolation point Pin0, which is the middle point between the digital sampling points P6 and P7, as shown in FIG. 6. The phase of the interpolation point Pin0 is (32+0)/2=16 (t). The value of the interpolation point Pin0 is given by:

$$h_{Pin0} = (h_{P7} + h_{P6})/2$$

wherein, $h_{Pin0}$ represents the value of the interpolation point Pin0, $h_{P6}$ represents that of the boundary point P6, and $h_{P7}$ represents that of the boundary point P7.

So that, in the assumption, $$h_{Pin0} = (2-1)/2 = 0.5$$

The interpolation unit 111a then outputs the value of $h_{Pin1}$. The ZC selection unit 111b receives the values of $h_{Pin1}$ and $h_{Pin0}$ and determines whether the signs of the values of $h_{Pin1}$ and $h_{Pin0}$ are the same. The signs of the value of $h_{Pin0}$ is "+" while the sign of the value of $h_{Pin1}$ is "−", meaning that there is a ZC point between the interpolation points Pin1 and Pin0. The ZC selection unit 111b outputs a selection signal Sel3 of logic "1" to the multiplexer 111c according to the determined result. In this embodiment, the selection signal is logic "0" when the signs are the same, and the selection signal is logic "1" when the signs are different. Thus, in the assumption, the selection signal Sel4 is logic "0".

The multiplexer 110c receives the values of $h_{P6}$ and $h_{P7}$ and outputs the value of $h_{P6}$ according to the selection signal Sel4 to serve as the value of the second boundary point of the next detection unit 111. Moreover, the interpolation unit 110a also outputs the value of $h_{Pin0}$ to serve as the value of the first boundary point of the detection unit 111.

Similarly, the interpolation unit 111a of the detection unit 111 receives the values of $h_{Pin0}$ and $h_{P6}$ respectively by the input terminals IN11 and IN12 and generates an interpolation point Pin1 which is the middle point between the interpolation point Pin0 and the digital sampling point P6, as shown in FIG. 6. Since the interpolation point Pin1 is located on the left side of the interpolation point Pin0, the phase of the interpolation point Pin1 is (16−32/2²)=8(t). The value of the interpolation point Pin1 is given by:

$$h_{Pin1} = (h_{Pin0} + h_{P6})/2$$

wherein, $h_{Pin1}$ represents the value of the interpolation point Pin1.

So that $$h_{Pin1} = (0.5-1)/2 = -0.25$$

The interpolation unit 111a then outputs the value of $h_{Pin1}$. The ZC selection unit 111b receives the values of $h_{Pin1}$ and $h_{Pin0}$ and determines whether the signs of the values of $h_{Pin1}$ and $h_{Pin0}$ are the same. The sign of the value of $h_{Pin0}$ is "+" while the sign of the value of $h_{Pin1}$ is "−", meaning that there is a ZC point between the interpolation points Pin1 and Pin2. The ZC selection unit 111b outputs a selection signal Sel3 of logic "1" to the multiplexer 111c according to the determined result.

The multiplexer 111c receives the values of $h_{Pin0}$ and $h_{P6}$ and outputs the value of $h_{Pin0}$ according to the selection signal Sel3 to serve as the value of the second boundary point of the next detection unit 112. Moreover, the interpolation unit 111a also outputs the value of $h_{Pin1}$ to serve as the value of the first boundary point of the detection unit 112.

Similarly, the detection units 112 to 114 perform the above interpolation operation with a bisection method to generate interpolation points Pin2 to Pin4. The interpolation point Pin4 is the point nearest the ZC point Pzc among the interpolation points Pin0 to Pin4, thus, serves as the ZC point Pzc. The detection units 112 to 114 also determine the signs of the values of the interpolation points Pin2 to Pin4 and output the selection signals Sel2 to Sel0.

Figure 7A:
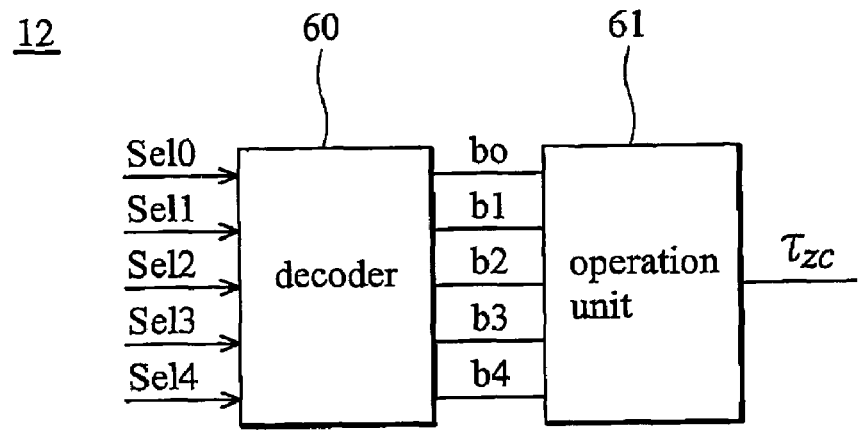
FIGS. 7a and 7b depicts an embodiment of a determining unit.

The determining unit 12 receives the selection signals Sel4 to Sel0 and obtains the phase of the ZC point Pzc according to the selection signals Sel4 to Sel0. In some embodiments, as shown in FIG. 7a, the determining unit 12 can be a decoder. A decoder 60 receives the selection signals Sel4 to Sel0 and decodes the selection signals Sel4 to Sel0 to obtain 5 bit-signals b0 to b4. An operation unit 61 calculates the bit-signals b0 to b4 in binary to obtain the phase of the ZC point Pzc:

$$\tau_{ZC}=2^4 \times b4+2^3 \times b3+2^2 \times b2+2^1 \times b1+2^0 \times b0$$

wherein, $\tau_{ZC}$ represents the phase of the ZC point Pzc. For example, when Sel4=0, Sel3=1, Sel2=0, Sel1=1, and Sel0=0, the decoder 60 obtains b4=0, b3=1, b2=1, b1=0, and b0=0, thus, the phase of the ZC point Pzc ($\tau_{ZC}$) is 12(t).

Figure 7B:
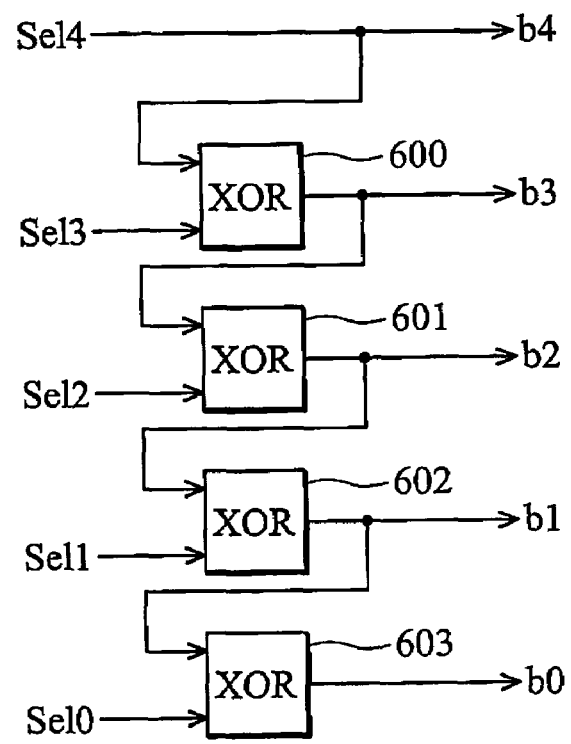

The decoder 60 can be implemented by XOR logic gates 600 to 603, as shown in FIG. 7b. The decoder 60 calculates the selection signals with an XOR operation to obtain bit-signals b0 to b4.

Figure 8:
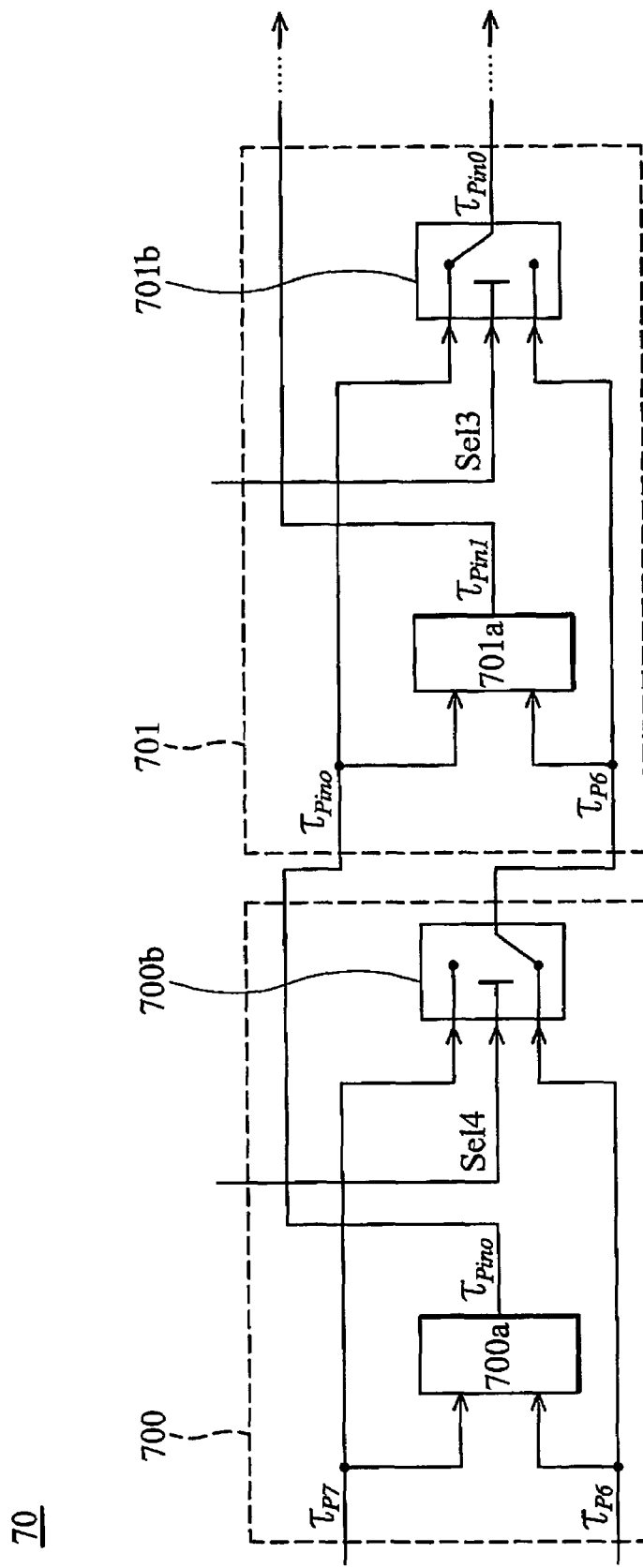
FIG. 8 depicts an embodiment of a determining unit.

In some embodiments, the determining unit 12 comprises a calculator 70. The calculator 70 receives the selection signals Sel4 to Sel0 and the phases of the digital sampling points P6 and P7 ($\tau_{P6}$ and $\tau_{P7}$). The calculator 70 calculates the phase of the interpolation points Pin0 to Pin4 and indicates the position of the ZC point Pzc according to the selection signals Sel4 to Sel0. Referring to FIG. 8, a calculator 70 comprises a plurality of calculation units. In this embodiment, the number of calculation units match the number of detection units. For clarity, FIG. 8 shows only two calculation units 700 and 701. The calculation unit 700 is given as an example. The calculation unit comprises an interpolation unit 700a and a multiplexer 700b. The interpolation unit 700a receives the phases of the digital sampling points P6 and P7 ($\tau_{P6}$ and $\tau_{P7}$) and calculates the phase of the interpolation point Pin0 ($\tau_{Pin0}$) by the bisection method. The interpolation unit 700a then outputs the phase of the interpolation point Pin0 ($\tau_{Pin0}$) to one input terminal of the interpolation unit 701a of the calculation unit 701. The multiplexer 700b receives the selection signal Sel4 from the detection unit 110 and the phases of the digital sampling points P6 and P7 ($\tau_{P6}$ and $\tau_{P7}$). The multiplexer 700b selects the phase of the digital sampling point P6 ($\tau_{P6}$) to the other input terminal of the interpolation unit 701a of the calculation unit 701 according to the selection signal Sel4. In the other words, the calculation unit 700 corresponds to the detection unit 110, and they both outputs the values related to the digital sampling points P6 to the next units. The calculation unit 701 performs the same operation as the calculation unit 700. The phase of the interpolation point Pin4 ($\tau_{Pin4}$) which serves as the ZC point Pzc can be calculated by the calculator 70.

In some embodiments, the determining unit 12 comprises a lookup table, as shown in FIG. 9. The lookup table collects a plurality of phases. When receiving the selection signals Sel4 to Sel0, the determining unit 12 selects one phase corresponding to the ZC point Pzc according to the selection signals Sel4 to Sel0. For example, when Sel4=0, Sel3=1, Sel2=0, Sel1=1, and Sel0=0, the phase of the ZC point Pzc ($\tau_{ZC}$) is 12(t).

When the phase of the ZC point Pzc is obtained, the jitter between the ZC point Pzc and the digital sampling point P6 can be calculated by:

$$\tau_{jit}=\tau_{ZC}-\tau_{P6}$$

wherein, $\tau_{jit}$ represents jitter between the ZC point Pzc and the digital sampling point P6, and $\tau_{P6}$ represents the phase of the digital sampling point P6.

Figure 10:
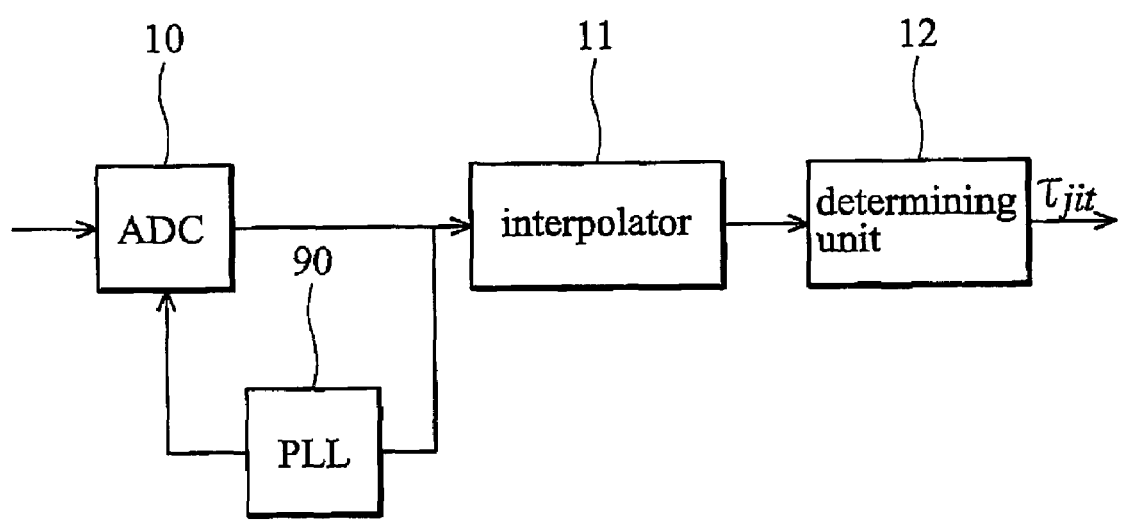
FIG. 10 depicts an embodiment of a phase detection device.

In some embodiments, as shown in FIG. 10, a phase detection device 9 further comprises a phase looked loop (PLL) circuit 90 couple to the ADC 10. The PLL circuit 90 is coupled to the (ADC) 10 and receives the digital signal SD. The PLL circuit 90 generates a clock synchronized with the digital signal SD to serve as the sampling clock CLK of the analog-to-digital converter. The phase of the ZC point Pzc ($\tau_{ZC}$) obtained by the determining unit 12 is thus equal to the jitter ($\tau_{jit}$) between the ZC point Pzc and the digital sampling point P6.

Figure 11:
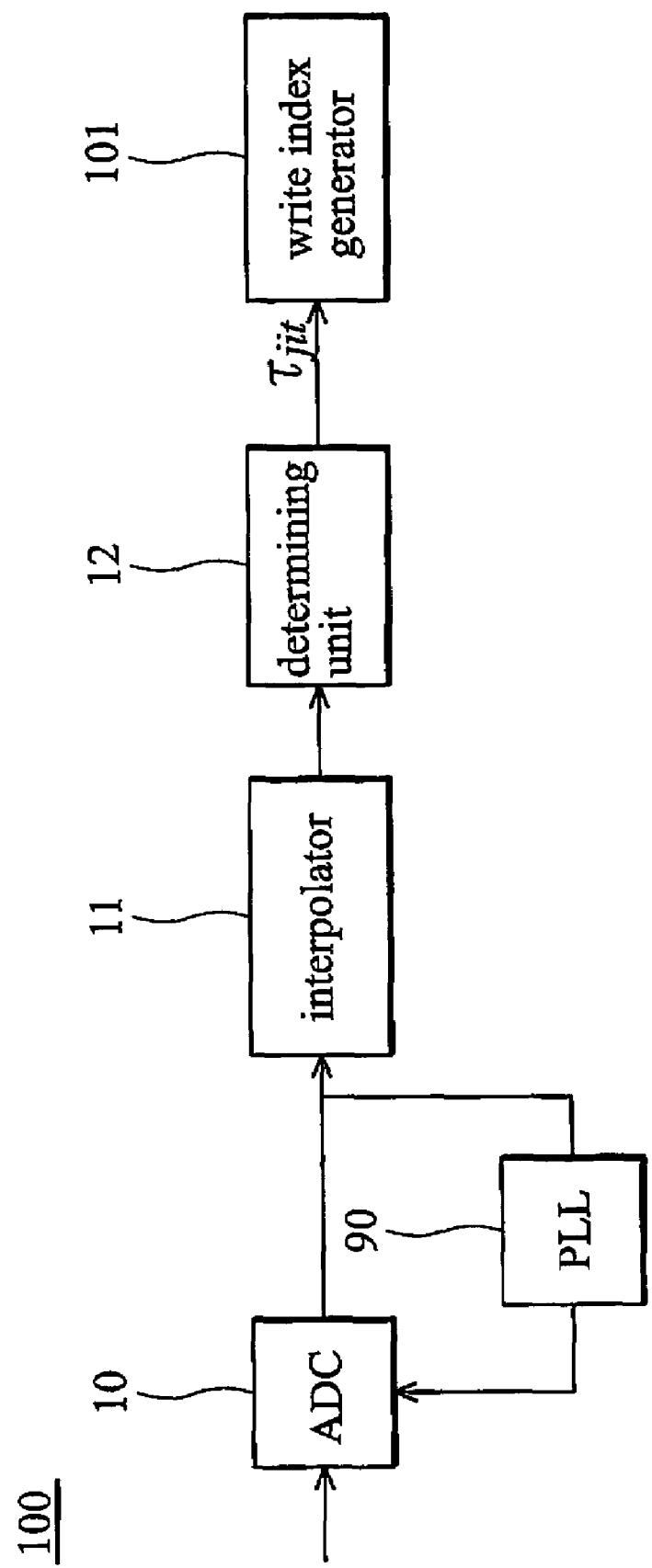
FIG. 11 depicts an embodiment of a regulation device.

In some embodiments, the jitters $\tau_{jit}$ can be applied as the index of write strategy of an optical disc drive. Referring to FIG. 11, a phase detection device 100 further comprises a write index generator 101 couple to the determining unit 12. One of the parameters related to the index of the write strategy is the average value of phase shifts of various data combinations. The write index generator 101 collects the jitters $\tau_{jit}$ related to the analog signal SA as statistical data. According to the statistics of the jitters $\tau_{jit}$, the write index generator 101 can used to adjust the write strategy for the optical disc drive. In one embodiment, the write index generator 101 calculates the mean jitter value of the raising edge of each data combination and mean jitter value of the falling edge of each data combination. Data set means the EFM data combination, such as 3T-3T combination, 3T-8T combination, 4T-5T combination, etc. The EFM data could be 3T to 11T and 14T data, and this is well known to the person skilled in the art. When the write index generator 101 generates the mean jitter value of each data combinations, the following circuit could use them to adjust the write strategy.

Figure 12:
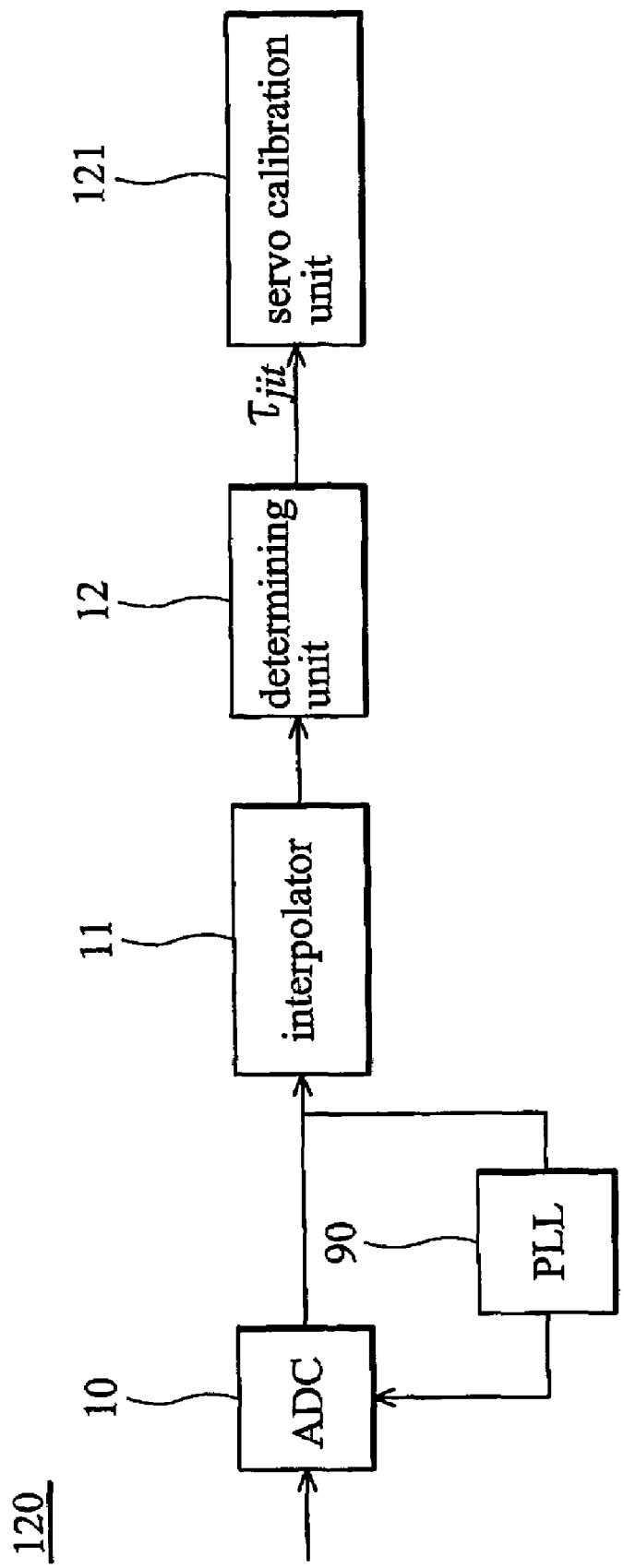
FIG. 12 depicts an embodiment of a calibration device.

In some embodiments, the jitter is generated when the servo is improper, so the jitters $\tau_{jit}$ can be also applied in the servo control of an optical disc drive. As shown in FIG. 12, a phase detection device 110 further comprises a servo calibration unit 121 couple to the determining unit 12. The servo calibration unit 121 receives the jitters $\tau_{jit}$ of the analog signal SA from the determining unit 12. The servo calibration unit 121 gets the jitter $\tau_{jit}$ and generates the servo parameters used in servo control, such as write/read focus balance and the tilt between a pick-up head of the optical disc drive.

Figure 13:
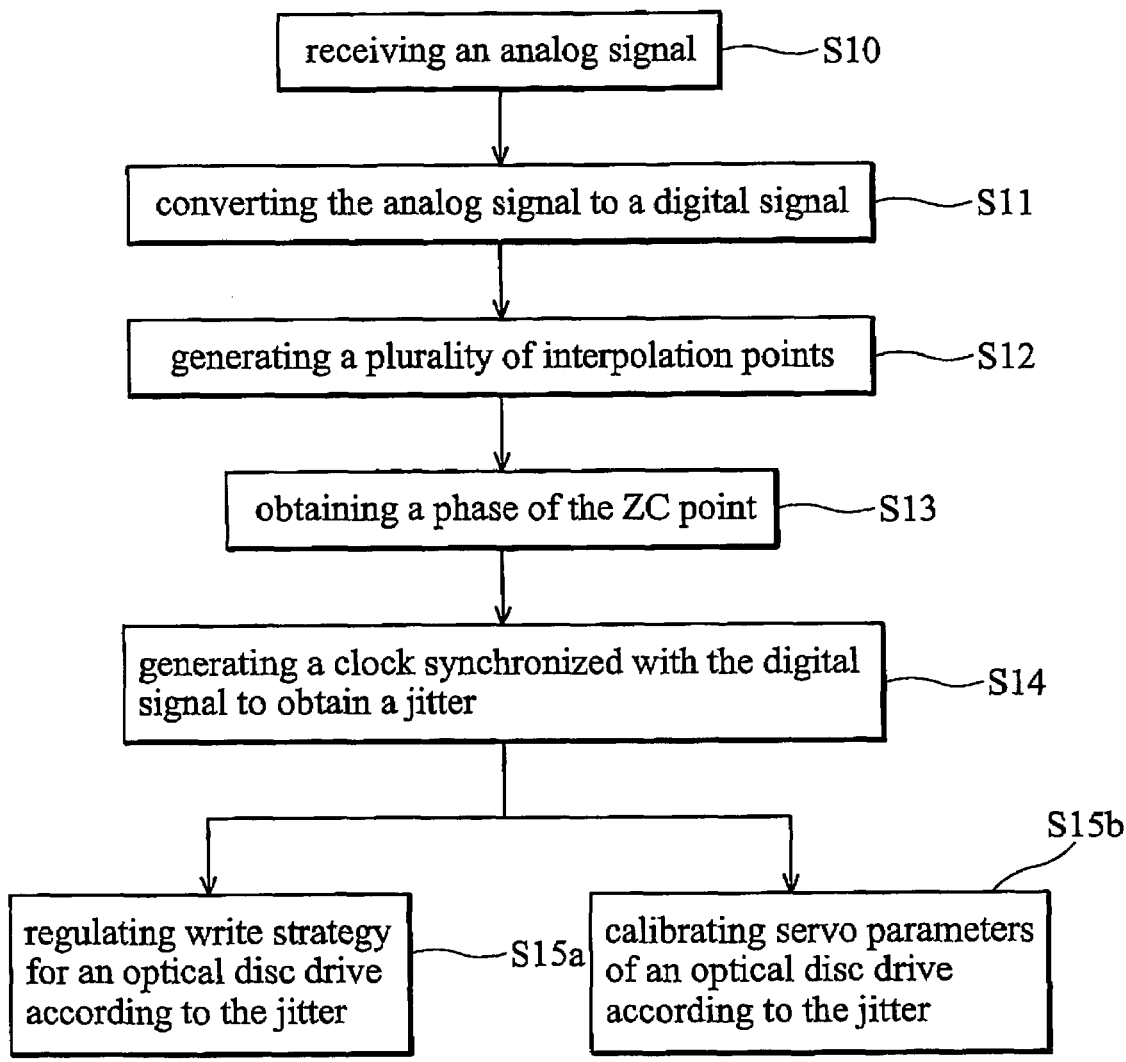
FIG. 13 is a flowchart showing an embodiment of a method for a phase detection device.

FIG. 13 is a flowchart showing an embodiment of a method for a phase detection device. Referring to FIGS. 1 and 13, an analog-to-digital converter 10 receives an analog signal SA (step S10) and converts the analog signal SA to a digital signal SD at a sampling clock according to a plurality of digital sampling points (step S11). An interpolator 11 generates a plurality of interpolation points according to a predetermined amount of digital sampling points (step S12). In some embodiments, the interpolator 11 uses a predetermined amount of boundary points to generate the interpolation points. The interpolator 11 generates one interpolation point between the predetermined amount of boundary points. In the embodiment of FIG. 13, the interpolator 11 uses two boundary points, a first and a second boundary points, adjacent to the ZC point to generate the interpolation points. When the interpolator 11 interpolates the first interpolation point, the boundary points are the predetermined amount of digital sampling points.

Figure 14:
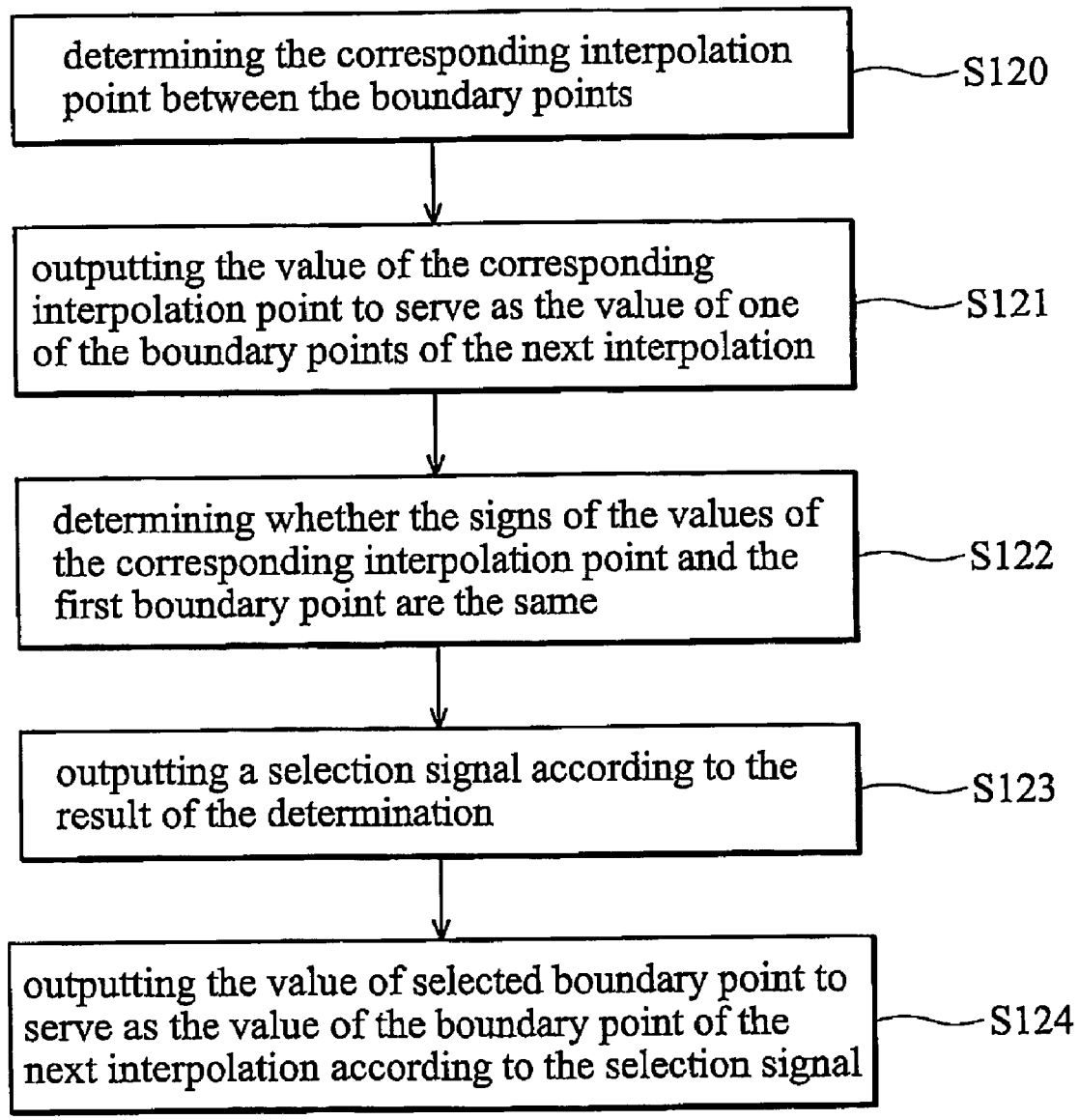
FIG. 14 is flowchart showing an embodiment of the step 12 in FIG. 13.

FIG. 14 is a flowchart of the step S12. Referring to FIGS. 4, 5 and 14, in step S12, the interpolation unit 110a of the detection unit 110 within the interpolator 11 receives the values of the boundary points and determines the corresponding interpolation point between the boundary points (step S120). The interpolation unit 110a outputs the value of the corresponding interpolation point to serve as the value of one of the boundary points of the next interpolation (step S121). The ZC selection unit 110b of the detection unit 110 receives the value of the corresponding interpolation point and the first boundary point and determines whether the signs of the values of the corresponding interpolation point and the first boundary point are the same (step S122). The ZC selection unit 110b outputs a selection signal according to the result of the determination (step S123). The multiplexer 110c of the detection unit 110 receives the values of the predetermined amount of boundary points and outputs the value of selected boundary point to serve as the value of the boundary point of the next interpolation according to the selection signal (step S124). The multiplexer 110c outputs the second boundary point when the signs of the values of the corresponding interpolation point and the first boundary point are the same, while the multiplexer 110c outputs the first boundary point when the signs of the values of the corresponding interpolation point and the first boundary point are different.

The determining unit 12 obtains the position or phase of the ZC point is determined according to the selection signals (step S13). In some embodiments of the step S13, the determining unit 12 can calculate the selection signals with an XOR operation to obtain the phase of the ZC point. In some embodiments of the step S13, the determining unit 12 can selects one of a plurality of phases which are collected in a lookup table according to the selection signals to serve as the ZC point. Referring to FIGS. 10 and 13, the phase looked loop (PLL) circuit 90 generates a clock synchronized with the digital signal to serve as the sampling clock (step S14). Accordingly, the obtained phase of the ZC point is equal to a jitter related to the ZC point. Referring FIGS. 11-13, a write index generator 101 regulates write strategy for a optical disc drive according to the jitter (step S15a), and a servo calibration unit 121 calibrates servo parameters of the optical disc drive according to the jitter (step S15b).

While the invention has been described in terms of preferred embodiment, it is to be understood that the invention is not limited thereto. On the contrary, it is intended to cover various modifications and similar arrangements as would be apparent to those skilled in the art. Therefore, the scope of the appended claims should be accorded the broadest interpretation so as to encompass all such modifications and similar arrangements.

What is claimed is:

1. A phase detection device comprising:
an analog-to-digital converter receiving an analog signal and converting the analog signal to a digital signal according to a plurality of digital sampling points;
an interpolator for generating a plurality of interpolation points to approach a zero-cross (ZC) point according to a predetermined amount of digital sampling points among the plurality of digital sampling points, wherein the interpolator interpolates an interpolation point between a predetermined amount of boundary points being interpolated at each time, determines the position of the ZC point according to a sign of a value of each interpolation point or a sign of a value of one of the corresponding boundary points and outputs a selection signal, and the predetermined amount of digital sampling points are adjacent to the ZC point; and
a determining unit obtaining a phase of the ZC point to express a phase difference between an interpolation point and one of the digital sampling points.

2. The phase detection device as claimed in claim 1, wherein the boundary points are the predetermined amount of digital sampling points when the interpolator interpolates the first interpolation point.

3. The phase detection device as claimed in claim 1, wherein the boundary points are changed and gotten closed to the ZC point when the interpolator generates the next interpolation point.

4. The phase detection device as claimed in claim 1, wherein the determining unit calculates the phase of the ZC point according to the selection signals.

5. The phase detection device as claimed in claim 1, wherein the interpolator comprises a plurality of detection units coupled in series, each detection unit comprises a predetermined amount of input terminals and a predetermined of output terminals, the predetermined amount of input terminals respectively receives the values of the predetermined amount of boundary points, the predetermined amount of output terminals of each detection unit are respectively coupled to the predetermined amount of input terminals of the next detection unit.

6. The phase detection device as claimed in claim 5, wherein in each detection unit, one of the output terminals outputs the value of the interpolation point to serve as the value of one of the boundary points of the next detection unit.

7. The phase detection device as claimed in claim 6, wherein each detection unit comprises:
an interpolation unit receiving the values of the predetermined amount boundary points, determining the corresponding interpolation point between a first and a second boundary points adjacent to the ZC point, and outputting the value of the corresponding interpolation point to serve as the value of one of the boundary points of the next detection unit;
a zero-cross (ZC) selection unit receiving the value of the corresponding interpolation point from the interpolation unit and the first boundary point, determining whether the signs of the values of the corresponding interpolation point and the first boundary point are the same, and outputting a selection signal according to the result of the determination through an additional output terminal of the detection unit to the determining unit; and
a multiplexer receiving the values of the predetermined amount of boundary points and outputting the value of selected boundary points to serve as the value of the boundary points of the next detection unit according to the selection signal.

8. The phase detection device as claimed in claim 7, wherein the multiplexer outputs the second boundary point when the signs of the values of the corresponding interpolation point and the first boundary point are the same, and the multiplexer outputs the first boundary point when the signs of the values of the corresponding interpolation point and the first boundary point are different.

9. The phase detection device as claimed in claim 1, wherein the interpolator outputs a plurality of selection signals according to signs of the values of the interpolation points or the digital sampling points, and the determining unit obtains the phase of the ZC point according to the selection signals.

10. The phase detection device as claimed in claim 9, wherein the determining unit is implemented by a decoder, and the decoder calculates the selection signals with an XOR operation to obtain the phase of the ZC point.

11. The phase detection device as claimed in claim 9, wherein the determining unit is implemented by a lookup table, and the lookup table collects a plurality of phases and selects one phase corresponding to the ZC point according to the selection signals.

12. The phase detection device as claimed in claim 9, wherein the determining unit comprises a calculator receiving the selection signals and the phase of the predetermined amount of digital sampling points, and the calculator calculates the phase of the ZC point according to the selection signals.

13. The phase detection device as claimed in claim 1 further comprising a phase looked loop (PLL) circuit receiving the digital signal and generating a clock synchronized with the digital signal to serve as a sampling clock of the analog-digital converter, and the phase obtained by the ZC point determining unit is equal to a jitter related to the ZC point.

14. The phase detection device as claimed in claim 13 further comprising a write index generator receiving the jitter and regulating write strategy for the optical disc drive according to the jitter.

15. The phase detection device as claimed in claim 13 further comprising a servo calibration unit receiving the jitter and calibrating servo parameters of the optical disc drive according to the jitter.

16. A phase detection device comprising:
an analog-to-digital converter receiving an analog signal and converting the analog signal to a digital signal according to a plurality of digital sampling points;
an interpolator for generating a plurality of interpolation points according to a predetermined amount of digital sampling points among the plurality of digital sampling points, wherein the interpolator interpolates an interpolation point between a predetermined amount of boundary points being interpolated at each time, determines a position of a zero-cross (ZC) point according to a sign of a value of each interpolation point or a sign of a value of one of the corresponding boundary points and outputs a selection signal, and the predetermined amount of digital sampling points are adjacent to the zero-cross (ZC) point; and
a determining unit obtaining a phase of the zero-cross (ZC) point according to the interpolation points or the digital sampling points; and
wherein the interpolation points are generated to approach the zero-cross (ZC) point.

17. The phase detection device as claimed in claim 16, wherein the boundary points are the predetermined amount of digital sampling points when the interpolator interpolates the first interpolation point.

18. The phase detection device as claimed in claim 16, wherein the boundary points are changed and gotten closed to the ZC point when the interpolator generates the next interpolation point.

19. The phase detection device as claimed in claim 16, wherein the determining unit calculates the phase of the ZC point according to the selection signals.

20. The phase detection device as claimed in claim 16, wherein the interpolator comprises a plurality of detection units coupled in series, each detection unit comprises a predetermined amount of input terminals and a predetermined of output terminals, the predetermined amount of input terminals respectively receives the values of the predetermined amount of boundary points, the predetermined amount of output terminals of each detection unit are respectively coupled to the predetermined amount of input terminals of the next detection unit.

21. The phase detection device as claimed in claim 20, wherein in each detection unit, one of the output terminals outputs the value of the interpolation point to serve as the value of one of the boundary points of the next detection unit.

22. The phase detection device as claimed in claim 21, wherein each detection unit comprises:
an interpolation unit receiving the values of the predetermined amount boundary points, determining the corresponding interpolation point between a first and a second boundary points adjacent to the ZC point, and outputting the value of the corresponding interpolation point to serve as the value of one of the boundary points of the next detection unit;
a zero-cross (ZC) selection unit receiving the value of the corresponding interpolation point from the interpolation unit and the first boundary point, determining whether the signs of the values of the corresponding interpolation point and the first boundary point are the same, and outputting a selection signal according to the result of the determination through an additional output terminal of the detection unit to the determining unit; and
a multiplexer receiving the values of the predetermined amount of boundary points and outputting the value of selected boundary points to serve as the value of the boundary points of the next detection unit according to the selection signal.

23. The phase detection device as claimed in claim 22, wherein the multiplexer outputs the second boundary point when the signs of the values of the corresponding interpolation point and the first boundary point are the same, and the multiplexer outputs the first boundary point when the signs of the values of the corresponding interpolation point and the first boundary point are different.

24. The phase detection device as claimed in claim 16, wherein the interpolator outputs a plurality of selection signals according to signs of the values of the interpolation points or the digital sampling points, and the determining unit obtains the phase of the ZC point according to the selection signals.

25. The phase detection device as claimed in claim 24, wherein the determining unit is implemented by a decoder, and the decoder calculates the selection signals with an XOR operation to obtain the phase of the ZC point.

26. The phase detection device as claimed in claim 24, wherein the determining unit is implemented by a lookup table, and the lookup table collects a plurality of phases and selects one phase corresponding to the ZC point according to the selection signals.

27. The phase detection device as claimed in claim 24, wherein the determining unit comprises a calculator receiving the selection signals and the phase of the predetermined amount of sampling points, and the calculator calculates the phase of the ZC point according to the selection signals.

28. The phase detection device as claimed in claim 16 further comprising a phase looked loop (PLL) circuit receiving the digital signal and generating a clock synchronized with the digital signal to serve as a sampling clock of the analog-digital converter, and the phase obtained by the ZC point determining unit is equal to a jitter related to the ZC point.

29. The phase detection device as claimed in claim 28 further comprising a write index generator receiving the jitter and regulating write strategy for the optical disc drive according to the jitter.

30. The phase detection device as claimed in claim 28 further comprising a servo calibration unit receiving the jitter and calibrating servo parameters of the optical disc drive according to the jitter.

31. The phase detection device as claimed in claim 16, wherein the determining unit obtaining a phase of the ZC point to express a phase difference between an interpolation point and one of the digital sampling points.

32. A method for a phase detection device comprising:
receiving an analog signal;
converting the analog signal to a digital signal at a sampling clock according to a plurality of digital sampling points;
generating a plurality of interpolation points to approach a ZC point according to a predetermined amount of digital sampling points among the plurality of digital sampling points; and
obtaining a phase of the ZC point according to the interpolation points or the digital sampling points,
wherein an interpolation point is generated between a predetermined amount of boundary points being interpolated at each time, the position of the ZC point is determined according to a sign of a value of each interpolation point or a sign of a value of one of the corresponding boundary points and a selection signal is output.

33. The method as claimed in claim 32, wherein the boundary points are the predetermined amount of digital sampling points when interpolating the first interpolation point.

34. The method as claimed in claim 32, wherein the boundary points are changed and gotten closed to the ZC point when generating the next interpolation point.

35. The method as claimed in claim 32, wherein the phase of the ZC point is calculated according to the selection signals.

36. The method as claimed in claim 32 further comprising:
receiving the values of the predetermined amount of boundary points, determining the corresponding interpolation point between a first and a second boundary points adjacent to the ZC point, and outputting the value of the corresponding interpolation point to serve as the value of one of the boundary points of the next interpolation;
receiving the value of the corresponding interpolation point and the first boundary point, determining whether the signs of the values of the corresponding interpolation point and the first boundary point are the same, and outputting a selection signal according to the result of the determination; and
receiving the values of the predetermined amount of boundary points and outputting the values of selected boundary points to serve as the values of the boundary points of the next interpolation according to the selection signal.

37. The method as claimed in claim 36, wherein the second boundary point is output when the signs of the values of the corresponding interpolation point and the first boundary point are the same, and the first boundary point is output when the signs of the values of the corresponding interpolation point and the first boundary point are different.

38. The method as claimed in claim 32, wherein a plurality of selection signals are output according to signs of the values of the interpolation points or the digital sampling points, and the phase of the ZC point is obtained according to the selection signals.

39. The method as claimed in claim 38, wherein the step of obtaining the phase of the ZC point comprises calculating the selection signals with an XOR operation to obtain the phase of the ZC point.

40. The method as claimed in claim 38, wherein the step of obtaining the phase of the ZC point comprises selecting one of a plurality of phases collected in a lookup table according to the selection signals to serve as the ZC point.

41. The method as claimed in claim 32 further comprising generating a clock synchronized with the digital signal to serve as the sampling clock, wherein the obtained phase of the ZC point is equal to a jitter related to the ZC point.

42. The method as claimed in claim 41 further comprising regulating write strategy for an optical disc drive according to the jitter.

43. The method as claimed in claim 41 further comprising calibrating servo parameters of an optical disc drive according to the jitter.

44. The method as claimed in claim 32, wherein the two digital sampling points is adjacent to the ZC point.

* * * * *